United States Patent
Jeong et al.

(10) Patent No.: US 11,139,833 B2
(45) Date of Patent: Oct. 5, 2021

(54) ADAPTIVE READ RETRY OPTIMIZATION

(71) Applicant: Seagate Technology LLC, Cupertino, CA (US)

(72) Inventors: Seongwook Jeong, Sunnyvale, CA (US); AbdelHakim Alhussien, San Jose, CA (US); Erich Franz Haratsch, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 79 days.

(21) Appl. No.: 16/589,564

(22) Filed: Oct. 1, 2019

(65) Prior Publication Data

US 2020/0036392 A1 Jan. 30, 2020

Related U.S. Application Data

(63) Continuation of application No. 15/491,453, filed on Apr. 19, 2017, now Pat. No. 10,469,103.

(51) Int. Cl.
*H03M 13/00* (2006.01)
*H03M 13/11* (2006.01)

(52) U.S. Cl.
CPC .... *H03M 13/1125* (2013.01); *H03M 13/1108* (2013.01); *H03M 13/6566* (2013.01)

(58) Field of Classification Search
CPC ......... H03M 13/1125; H03M 13/1108; H03M 13/6566; H03M 13/45; G06F 11/1068; G11C 29/52; G11C 16/26; G11C 29/42; G11C 11/4074; G11C 11/5642; G11C 16/08; G11C 11/409; G11C 11/419; G11C 11/1673

See application file for complete search history.

(56) References Cited

U.S. PATENT DOCUMENTS

| | | | |
|---|---|---|---|
| 3,648,238 A | 3/1972 | Yarrington | |
| 8,111,596 B2 | 2/2012 | Sakai | |
| 8,243,511 B2* | 8/2012 | Patapoutian | G11C 16/0483 365/185.02 |
| 8,363,478 B1 | 1/2013 | Yang et al. | |
| 8,392,809 B1* | 3/2013 | Varnica | H03M 13/2906 714/794 |
| 8,531,888 B2 | 9/2013 | Chilappagari et al. | |
| 9,064,563 B2 | 6/2015 | Khoueir et al. | |
| 9,104,591 B2 | 8/2015 | Tam | |

(Continued)

OTHER PUBLICATIONS

Cai, et al., "Data Retention in MLC NAND Flash Memory: Characterization, Optimization, and Recovery", Proceedings of the IEEE Symposiun on High Performance Computer Architecture, Carnegie Mellon University, Feb. 2015, 14 pages.

(Continued)

*Primary Examiner* — Esaw T Abraham

(74) *Attorney, Agent, or Firm* — Kirk A. Cesari; Christian W. Best

(57) ABSTRACT

Systems, devices, and methods are presented that allow a data channel to adaptively vary a change in a reference voltage used to read data from a solid state memory. The change in the reference voltage may be determined based on a measured error statistic of the solid state memory. A hard decision low density parity check (HLDPC) decoder may be utilized in conjunction with a soft decision low density parity check (SLDPC).

20 Claims, 8 Drawing Sheets

(56) References Cited

U.S. PATENT DOCUMENTS

| | | |
|---|---|---|
| 9,153,336 B1 | 10/2015 | Yang et al. |
| 9,245,580 B1 | 1/2016 | Lu |
| 9,417,797 B2 | 8/2016 | Chen |
| 9,680,504 B2 | 6/2017 | Kim |
| 9,792,176 B2 | 10/2017 | Blaichman et al. |
| 9,842,659 B2* | 12/2017 | Nam .................. G11C 29/025 |
| 9,847,135 B2 | 12/2017 | Hara |
| 9,952,926 B2* | 4/2018 | Yen ..................... G06F 11/1012 |
| 9,978,462 B2* | 5/2018 | Ravimohan ......... G06F 11/1068 |
| 10,158,380 B2* | 12/2018 | Sharon .................. G06F 3/0619 |
| 2005/0106666 A1 | 5/2005 | Goodearl |
| 2010/0034018 A1* | 2/2010 | Yang .................. G11C 11/5642 365/185.2 |
| 2010/0251076 A1 | 9/2010 | Wu et al. |
| 2012/0072805 A1* | 3/2012 | Tseng ................. G06F 11/1048 714/773 |
| 2012/0213001 A1 | 8/2012 | Yang |
| 2012/0297273 A1* | 11/2012 | Sakaue ............. H03M 13/1188 714/773 |
| 2013/0139035 A1 | 5/2013 | Zhong et al. |
| 2014/0185386 A1 | 7/2014 | Yang |
| 2014/0229131 A1 | 8/2014 | Cohen et al. |
| 2014/0233322 A1 | 8/2014 | Wu et al. |
| 2014/0281823 A1* | 9/2014 | Micheloni .......... H03M 13/1111 714/773 |
| 2016/0034206 A1 | 2/2016 | Ryan et al. |
| 2016/0162352 A1 | 6/2016 | Singhai et al. |

OTHER PUBLICATIONS

Wang et al., "Soft Information for LDPC Decoding in Flash: Mutual-Information Optimized Quantization", Department of Electrical Engineering, University of California, Los Angeles, 2011, 6 pages.

Haratsch, "NAND Flash Media Management Algorithms", Seagate, Flash Memory Summit, 2016, California, US, 23 pages.

Eshghi et al, "SSD Architecture and PCI Express Interface", Enterprise Computing Division, Integrated Device Technology, Inc., San Jose, CA, USA, 2012, 28 pages.

Zhao et al., "LDPC-in-SSD: Making Advanced Error Correction Codes Work Effectively in Solid State Drives", ECSE Department, Rensselaer Polytechnic Institute, USA, Feb. 2013, 30 pages.

Zhao et al., "LDPC-in-SSD: Making Advanced Error Correction Codes Work Effectively in Solid State Drives", ECSE Department, Rensselaer Polytechnic Institute,11th USENIX Conference on File and Storage Technologies (FAST '13), 2013, 14.

* cited by examiner

ADAPTIVE READ RETRY OPTIMIZATION

CROSS-REFERENCE TO RELATED APPLICATION

The present application is a continuation of and claims priority to U.S. patent application, application Ser. No. 15/491,453, now U.S. Pat. No. 10,469,103 issued on Nov. 5, 2019, originally filed Apr. 19, 2017, entitled "Adaptive Read Retry Optimization", the contents of which are hereby incorporated by reference in their entirety.

SUMMARY

In some embodiments, an apparatus may include: read logic configured to read a cell in a solid state memory device via a reference voltage ($V_{ref}$); memory configured to store a value indicating the $V_{ref}$; hard low density parity check (LDPC) decoder logic configured to perform a first decoding of a selected data based on the read logic applying the $V_{ref}$; adaptation logic configured to selectively shift the $V_{ref}$ by an amount, $V_{Delta}$, to produce a shifted voltage reference value ($V_{ref\_shifted}$); soft LDPC decoder logic configured to perform a second decoding of the selected data utilizing the $V_{ref\_shifted}$ as a read voltage value by the read logic when the hard LDPC decoder logic cannot successfully decode the data; and calculation logic configured to calculate and vary $V_{Delta}$ adaptively based on a profile of the solid state memory device. The soft LDPC decoder logic can be configured to perform further decoding attempts of the selected data with each of the further decoding attempts utilizing an adaptively calculated $V_{Delta}$.

In some embodiments, a data storage device can include: solid state memory and a data channel circuit. The data channel circuit can include: read logic configured to read a cell in a solid state memory device via a reference voltage ($V_{ref}$); memory configured to store a value indicating the $V_{ref}$; first decoder logic configured to perform a first decoding of selected data based on the read logic applying the $V_{ref}$; adaptation logic configured to selectively shift the $V_{ref}$ by an amount, $V_{Delta}$, to produce a shifted voltage reference value ($V_{ref\_shifted}$); second decoder logic configured to perform a second decoding of the selected data utilizing the $V_{ref\_shifted}$ as a read voltage value by the read logic when the first decoder logic cannot successfully decode the data; and calculation logic configured to calculate and vary $V_{Delta}$ adaptively based on a profile of the solid state memory device.

In some embodiments, a method include performing, via a first decoder, a first decoding of a selected data based on read logic applying a reference voltage ($V_{ref}$) to a solid state memory; selectively shifting the $V_{ref}$ by an amount, $V_{Delta}$, to produce a shifted voltage reference value ($V_{ref\_shifted}$); performing, via a second decoder, a second decoding of the selected data utilizing the $V_{ref\_shifted}$ as a read voltage value when the first decoding did not successfully decode the data; and adaptively calculate $V_{Delta}$ based on a profile of the solid state memory device.

DETAILED DESCRIPTION

In the following detailed description of the embodiments, reference is made to the accompanying drawings which form a part hereof, and in which are shown by way of illustrations. The features of the various embodiments and examples described herein may be combined, exchanged, removed, other embodiments utilized, and structural changes made without departing from the scope of the present disclosure.

The illustrations, examples, and embodiments described herein are intended to provide a general understanding of the structure of various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

In accordance with various embodiments, dedicated hardware implementations including, but not limited to, application specific integrated circuits, programmable logic arrays, and other hardware devices can be constructed to implement the methods and functions described herein. Further, the methods and functions described herein may be implemented as a device, such as a memory device, including instructions that when executed cause a processor to perform the methods.

Figure 1:
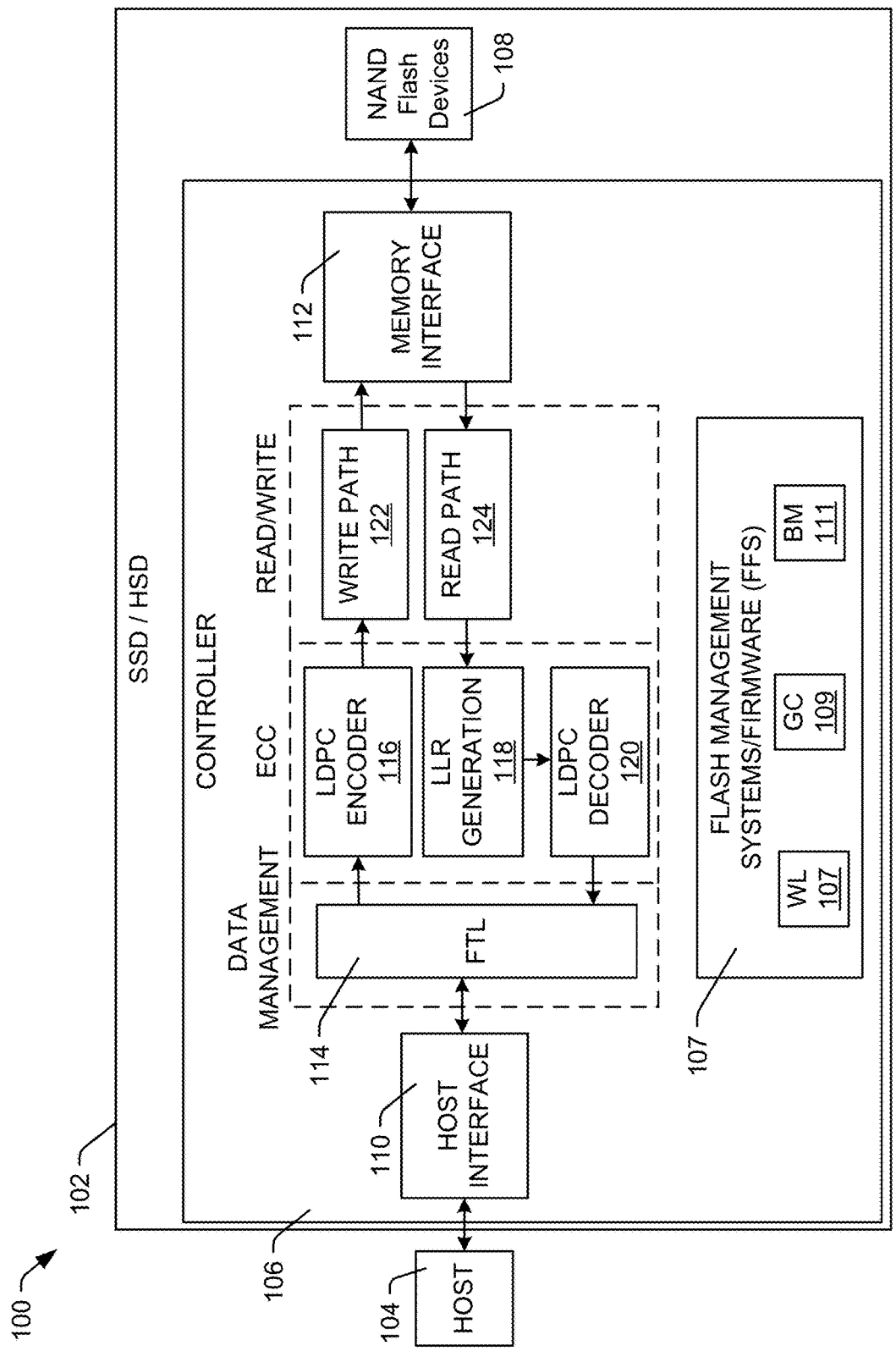
FIG. 1 is a block diagram of a system of adaptive read retry optimization, in accordance with certain embodiments of the present disclosure.

Referring to FIG. 1, a diagram of a system of adaptive read retry optimization is shown and generally designated 100, in accordance with certain embodiments of the present disclosure. Specifically, FIG. 1 provides a functional block diagram of an example data storage device (DSD) 102 and host 104. The DSD 102 may be a solid state data storage device (SSD) or a hybrid data storage device (HSD) or any other type of data storage device for which the present systems and processes may be beneficial.

The DSD 102 can include one or more data storage mediums, such as one or more solid state memories 108, which can be flash memory. The DSD 102 can communicate with a host device 104 via a hardware and firmware-based interface circuit 110. The interface 104 may comprise any interface that allows communication between the host 104 and the DSD 102, via either wired or wireless connection, such as Universal Serial Bus (USB), IEEE 1394 (Institute of Electrical and Electronics Engineers standard 1394), Compact Flash, Serial AT Attachment (SATA), external SATA (eSATA), Parallel ATA (PATA), Small Computer System Interface (SCSI), Serial Attached SCSI (SAS), Peripheral Component Interconnect Express (PCIe), Fibre Channel, Ethernet, or Thunderbolt, among others. The host interface 110 may include a connector (not shown) that allows the DSD 102 to be physically removed from the host 104. In some embodiments, the DSD 102 may have a casing or housing containing the components of the DSD 102, or the components of the DSD 102 may be attached to the housing, or a combination thereof.

The DSD 102 can include a programmable controller 106, which can include various circuits and functions that allow the controller to perform data management, error correcting code (ECC), and read/write processes. The controller 106 may also include a memory interface 112 that allows data to be stored to and read from the solid state memory 108. The controller 106 may also include a flash translation layer (FTL) 114 to map sectors and pages from logical addresses to physical addresses, which may be implemented via tables. The controller 106 can also include a flash file system (FFS) 107 that can control and perform wear leveling management (WL) 107, garbage collection (GC) 109 and bad block management (BM) 111, all of which may be implemented via firmware.

The controller 106 may also perform error correction via utilizing error correcting code (ECC), which may be implemented via one or more circuits, firmware, or a combination thereof. The error correction may include a low density parity check (LDPC) encoder 116, a log-likelihood ratio (LLR) generator 118, and a LDPC decoder 120. The LDPC encoder 116 can encode data bits based on a specific LDPC code to store data at the solid state memory 108 via a write path 122 and the memory interface 112. LDPC codes may vary based on SSD endurance requirements or other memory design requirements. The LDPC decoder 120 can decode data from the solid state memory 108 based on the LDPC code of the encoder 116; the LDPC decoder may receive soft information as an input from the LLR generation 118 which can determine the information based on bits received from the read path 124.

The LLR generation 118 can provide a soft estimation for the data bits of the memory cells of a memory sector of the memory 108. For example, the LLR generation 118 can provide the information in the form of log-likelihood ratios (LLRs), which is a probability of each data bit being 0 or 1. The LLRs are indicative of a confidence in zero ("0") or one ("1") for each data bit read from the memory 108. Based on the estimated LLRs for the data bits, the decoder module 120 can decode the data. A positive LLR can indicate a greater probability of the data bit being equal to 0, and a negative LLR can indicate a greater probability of the data bit being equal to 1. Generally, a sign of the LLR can provide an estimation of the data bit, and a magnitude of the LLR can provide a reliability of the estimation.

Generally, during operation, the controller 106 can implement a read retry reference voltage (Vref) delta algorithm. That is, the controller 106 may modify the amount of change of a reference voltage between iterative attempts to apply a variable reference voltage to read data from a solid state memory. In some examples, a change in reference voltage may be done between read attempts of a page of data in a flash memory device. Further, a read retry Vref delta can be estimated based on a profile obtained via a process of error tracking, such as hard decision decoding (HDD) tracking or syndrome weight (SW) tracking.

In some examples, a LLR lookup table (LUT) can be provided for soft-decision LDPC (SLDPC) decoding. An initially optimized offset value, which can be determined by flash pre-characterization, can be utilized as the offset to be applied to the voltage reference between read attempts. In some embodiments, this offset value is fixed and does not change through the lifetime of usage of the memory device. Therefore, the fixed offset value may not reflect different conditions of the memory over time, such as program/erase count (PEC) and retention. Also, such a scheme applies only one delta value for all page types and reference voltage locations.

However, in other embodiments, an on-the-fly adaptive read retry Vref delta optimization can be implemented based on one or more conditions (PEC, retention, page type, Vref location, etc.). The on-the-fly adaptive read retry Vref delta optimization can provide a delta to adjust the offset value applied to voltage reference for each iteration of reads as the voltage reference is passed through a range of voltages. Thus, the reference voltage may adjust by a variable amount.

Figure 2:
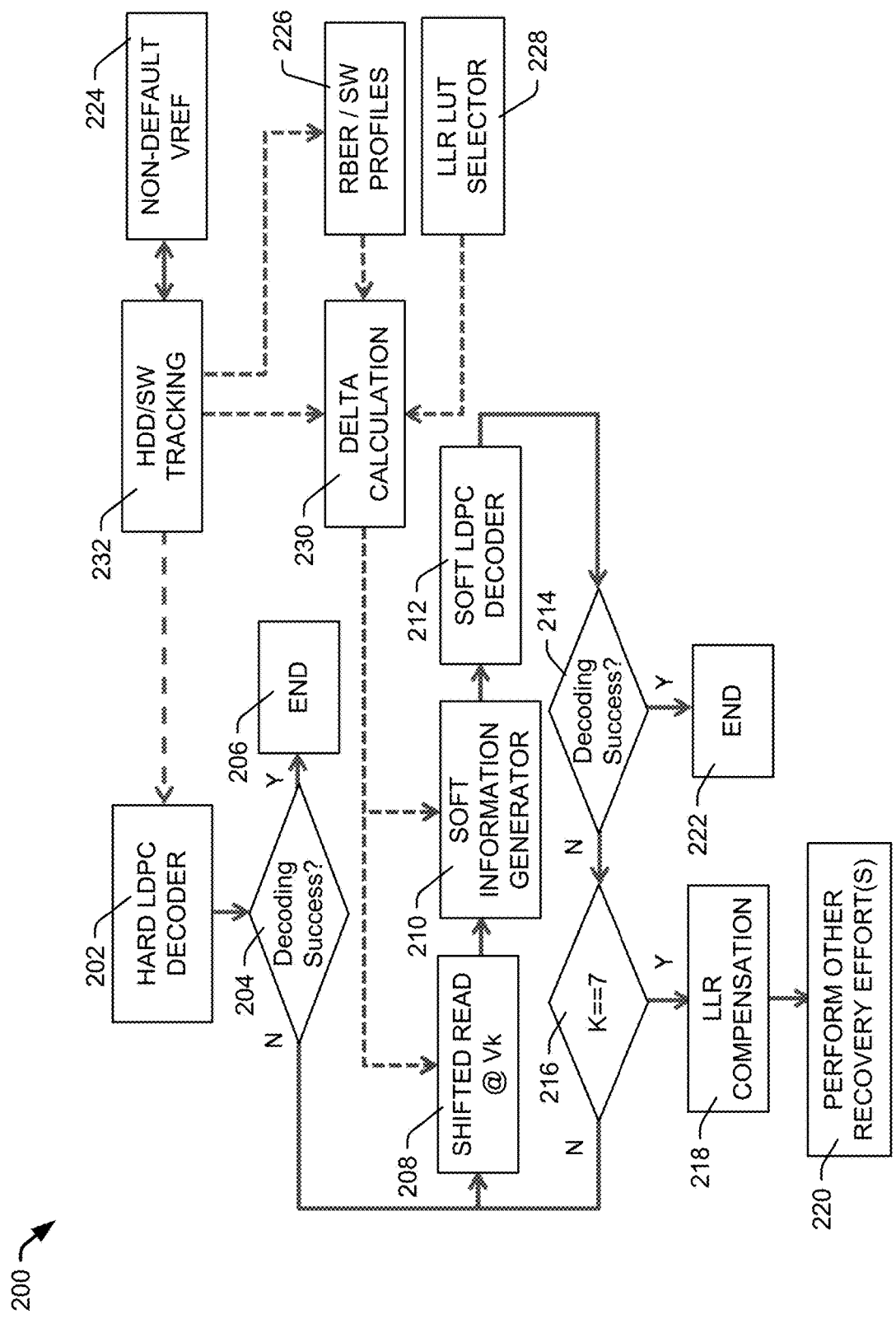
FIG. 2 is a flowchart of a process of adaptive read retry optimization, in accordance with certain embodiments of the present disclosure.

Referring to FIG. 2, a diagram of a system of adaptive read retry optimization is shown and generally designated 200, in accordance with certain embodiments of the present disclosure. Specifically, FIG. 2 provides a functional block diagram of example functions and systems of a data storage controller (e.g. controller 106). Generally, the system 200 can implement an adaptive read retry scheme for solid state memory, such as NAND flash memory.

The system 200 may include a hard-decision LDPC decoder 202, a HDD tracking module 232, memory 224 to store a non-default Vref value, memory 226 to store raw bit error rate (RBER) or syndrome weight (SW) profile(s), a delta calculation module 230, a shifted read module 208, a soft information generator (e.g. log likelihood ratio (LLR)) module 210, and a soft-decision LDPC decoder 212. In addition, other functions or modules may be present.

During operation of the system 200, when a hard LDPC decoder 202 attempts to decode a selected codeword, a determination may be made if the decoding is successful, at 204. If the decoding was successful, the decoding process may end, at 206. If the decoding process was not successful, the system 200 may implement a shifted read of the physical data locations corresponding to the selected codeword, at 208. The shifted read may include reading one or more data locations using a reference voltage (Vref) that has been shifted (e.g. a higher or lower voltage).

The soft information generator module 210 can provide a computation of soft information (e.g. log likelihood ratios (LLRs)) based on one or more read decisions. The soft information can be passed to a soft LDPC decoder 212 to attempt to decode the codeword. A determination may be made if the decoding is successful, at 214, and if the decoding was successful, the decoding process may end, at 222. If the decoding process was not successful, the system 200 may determine if a threshold number of read retry attempts has occurred, at 216, such as by comparing a count of read attempts to a threshold number of read attempts. If the threshold number of read attempts has not been reached, then the reread process may be performed again with another shifted read, at 208.

If the threshold number of read attempts has been reached, LLR compensation module 218 may compensate the LLR and update the LLR LUT. The system 200 may then perform other functions or recovery efforts, at 220, such as recovering data based on a redundancy across multiple data storage elements (e.g. RAID type redundancy).

The delta calculation module 230 may determine a value the system 200 should shift the amount of voltage to for a re-read. The delta calculation module 230 may also provide information to the soft information generator 210. The delta calculation module 230 may provide a variable (e.g. adaptive) delta for shifting the Vref per each read attempt. Thus, in some embodiments, the Vref for each read can be shifted by a different value each reread. For example, the first reread may be at Vref+$\Delta_1$, the second reread may be at Vref+$\Delta_2$, the third reread may be at Vref+$\Delta_3$, and so on, where $\Delta_1$, $\Delta_2$, $\Delta_3$, etc. are unique values.

The delta calculation module 230 may utilize a LLR look up table (LUT) selector 228 that can provide a number of errors used to calculate the delta values. The delta calculation module 230 may utilize the RBER/SW profile(s) stored in a memory 226 to calculate the delta values. Further, delta calculation module 230 may receive a calculated optimal Vref and a profile from the tracking module 232, which can utilize a non-default Vref value stored in memory 224. A non-default Vref value may be different from a preset default Vref value, and may be obtained by flash pre-characterization, online tracking, or a combination thereof. The tracking module 232 may also update the profiles. The tracking module 232 may be an online tracking module and may be implemented as a hard decision decoding (HDD) tracking module or a syndrome weight (SW) tracking module, examples of which are provided herein. Online tracking can occur within the channel hardware or software (or a combination of both) and can utilize read operations, initiated by a host or reads for other purposes such as internal background processes of the DSD, without the utilized reads being initiated solely for the tracking process.

The system 200 may be utilized to determine adaptive deltas for utilization during a read retry scheme of a solid state memory. The number of read retries and attempted Vrefs with variable deltas can be chosen by the system designer, which may be decided by the amount of granularity or complexity of the system.

Figure 3:
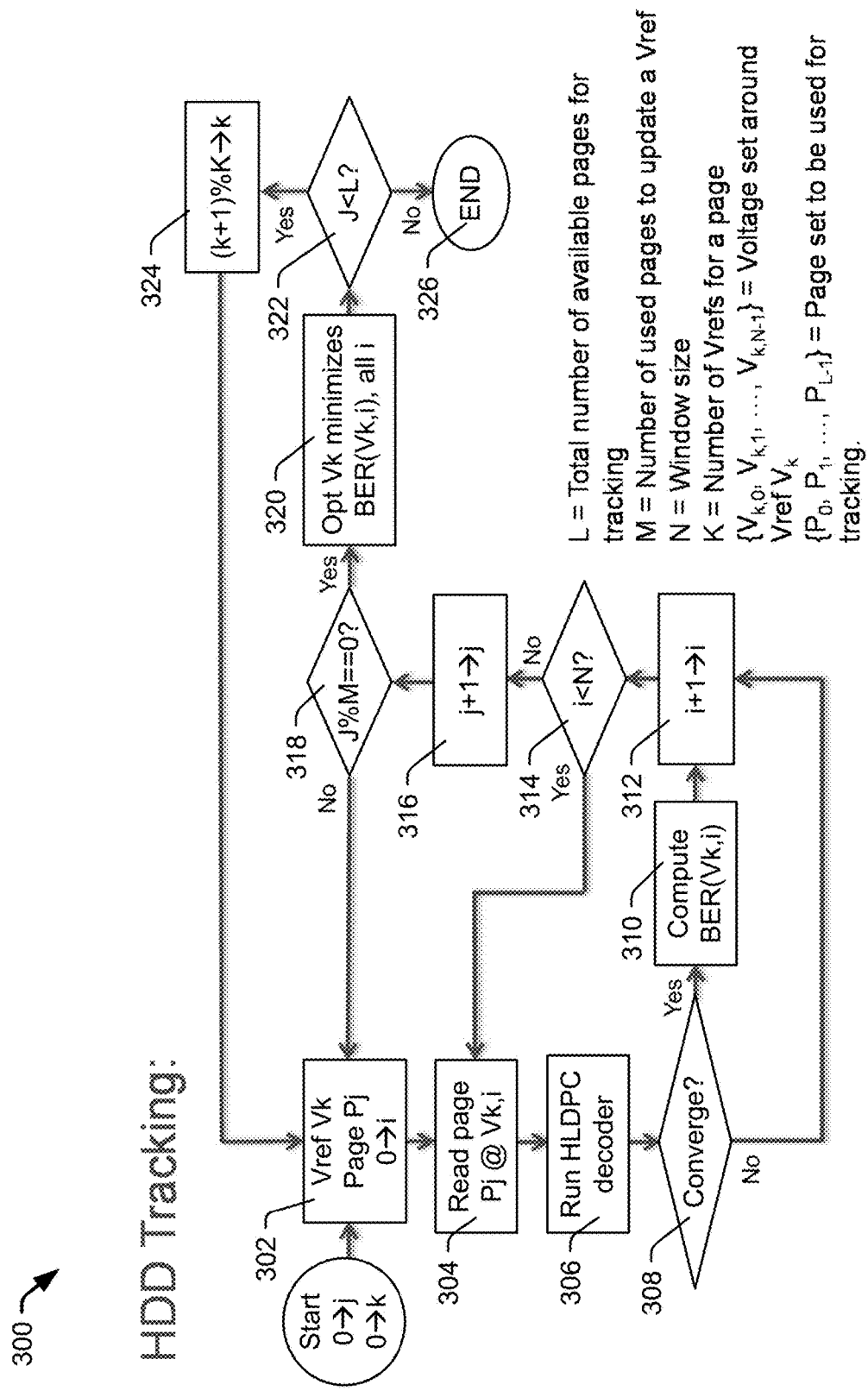
FIG. 3 is a flowchart of a process of adaptive read retry optimization, in accordance with certain embodiments of the present disclosure.

Referring to FIG. 3, a flowchart of a process of adaptive read retry optimization is shown and generally designated 300, in accordance with certain embodiments of the present disclosure. The process 300 shows certain embodiments of a method that can be utilized for hard decision decoding (HDD) tracking. In some examples, the method 300 may be utilized in method 200 to perform the HDD tracking 232.

The method may start, at 302, with a selected voltage (Vref) to be implemented to read data from a selected page of a solid state memory. The page may be read, at 304, and the results may be processed by a HLDPC decoder, at 306, to produce a codeword. The method 300 may determine if the HLDPC decoder converges to a codeword, at 308, and can determine a bit error rate (BER) for the page and voltage combination, at 310. The method 300 may perform one or multiple reads of the page to determine the BER for that combination, thus the method 300 may select another Vref to read the page with, at 312, and while not all Vref in the read window are exhausted, at 314, the page read process may be repeated, at 304. The number of page reads "N" represents the number of Vrefs that can be swept through to collect the BER or syndrome weight profile, which may also be referred to as window size or read window. On the other hand, "M" represents the number of pages that can be used to average the BER and syndrome weight statistics for a certain Vref, "L" is the total number of pages to track all Vref, and K is the number of Vrefs to track for a page type which, for example, can be 1 or 2 for MLC flash, or between 1 and 4 for triple-level cell (TLC) flash.

Once the maximum number of reads in the Vref read window has been reached, at 314, another page may be selected, at 316. The collection of BER profile statistics is implemented independently for the reference Vrefs that are used to read a certain page type. For example, in some systems, a most significant bit (MSB) page in a multi-level cell (MLC) flash memory can have two different Vrefs used to read the page. Hence the big loop (324 to 302) of the system described in 300 repeats twice for the MSB page in MLC flash. If the threshold number of pages to update a Vref has not been met, at 318, the next page may be read utilizing another set of N reads at N different Vref offsets and the BER computation process can be repeated for the selected page. In some examples, a modulus operation ("%") can be performed at 318 to determine if the number of pages to determine a Vref optimization have been processed; e.g. all numbers can be taken from 0 to M at 318, since each Vref optimization requires M pages, and each of those pages is read N times within a certain read window. Once a preset amount of data (e.g. BERs) have been calculated from pages read, at 318, the method 300 may optimize the BER, at 320. To optimize the BER, the system may collect the computed BERs for each of the number of tested Vrefs within the window size, which may include a computed BER for each page per each Vref tested. Optimization of the BER may be accomplished via any technique that selects a Vref to minimize the BER.

The process 300 may repeat itself up to a total or threshold number of pages available for tracking. Such may be preset or user configurable. If the page is less than the total number of pages available for tracking, at 322, the method 300 may include selecting another Vref from the Vrefs that can be used to sense that page type, at 324. Once the total number of pages available for tracking has been met, at 322, the method 300 may end, at 326.

Figure 4:
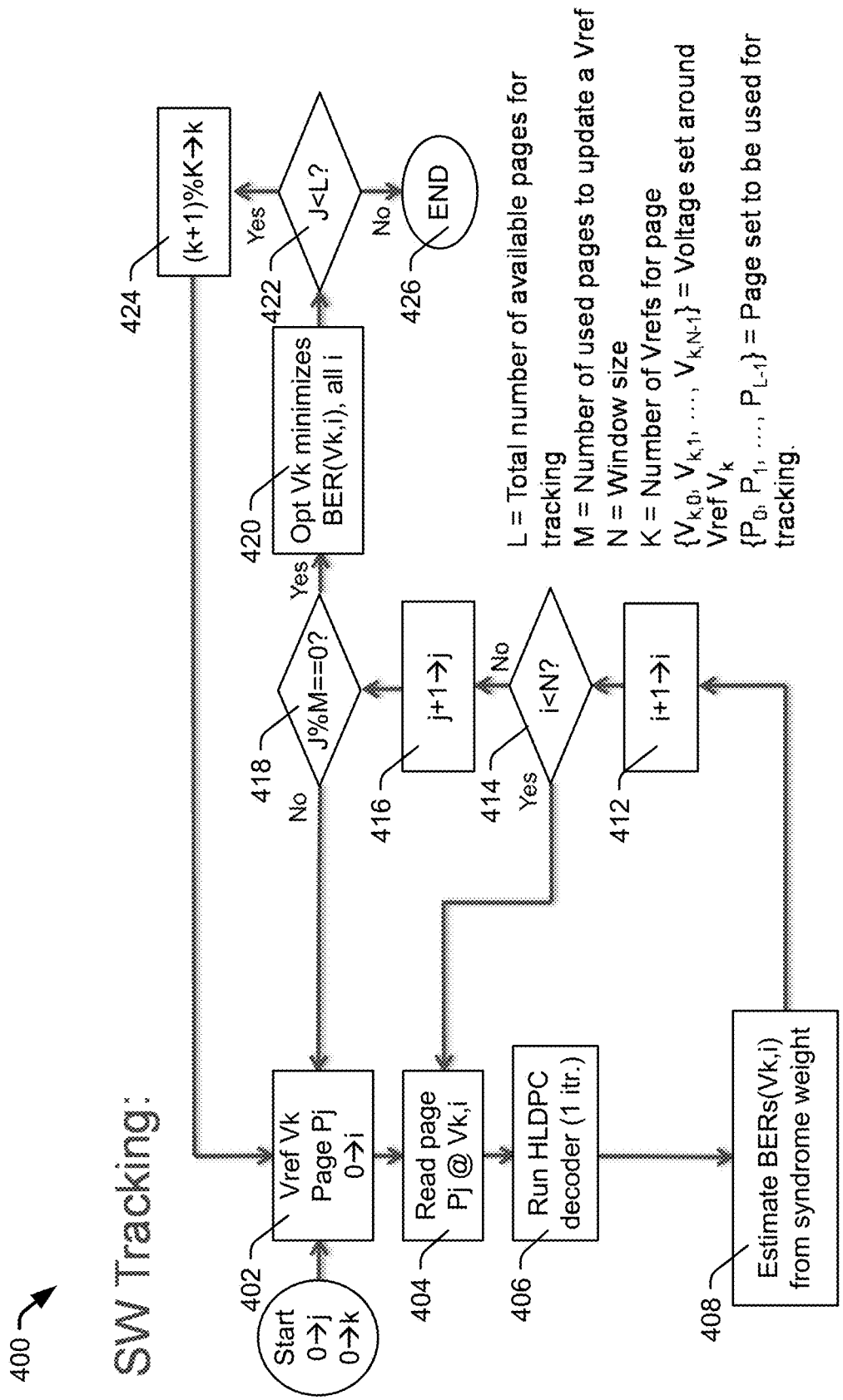
FIG. 4 is a flowchart of a process of adaptive read retry optimization, in accordance with certain embodiments of the present disclosure.

Referring to FIG. 4, a flowchart of a process of adaptive read retry optimization is shown and generally designated 400, in accordance with certain embodiments of the present disclosure. The process 400 shows certain embodiments of a method that can be utilized for syndrome weight (SW) tracking. In some examples, the method 400 may be utilized in method 200 to perform the SW tracking 232.

The method may start, at 402, with a selected voltage (Vref) to be implemented to read data from a selected page of a solid state memory. The page may be read, at 404, and the results may be processed by a HLDPC decoder, at 406, to produce a syndrome weight. A single iteration or portion thereof of the HLDPC decoding may be performed, at 406, and the syndrome weight can be utilized to compute an estimate of the BER for that page and Vref combination. The method 400 may perform one or multiple reads of the page to estimate the BER for that combination, at 412, thus when less than a number of reads of the page have occurred, at 414, the page read process may be repeated, at 404.

Once the number of page reads have been reached, at 414, another page may be selected, at 416, if the threshold number of pages has not been met, at 418. The next page may be read to optimize the same Vref as the previous page, from 418 to 402, and the BER computation process can be repeated for the selected Vref. Once a preset number of pages have been read for the specific Vref optimization, at 418, the method 400 may optimize the BER for the Vref, at 420.

The process 400 may repeat itself up to a total or threshold number of pages available for tracking. Such may be preset or user configurable. If the page is less than the total number of pages available for tracking, at 422, the method 400 may include selecting another $V_{ref}$ from a number of Vrefs to sense that page type, at 424. Once the total number of pages available for tracking has been met, at 422, the method 400 may end, at 426.

Figure 5:
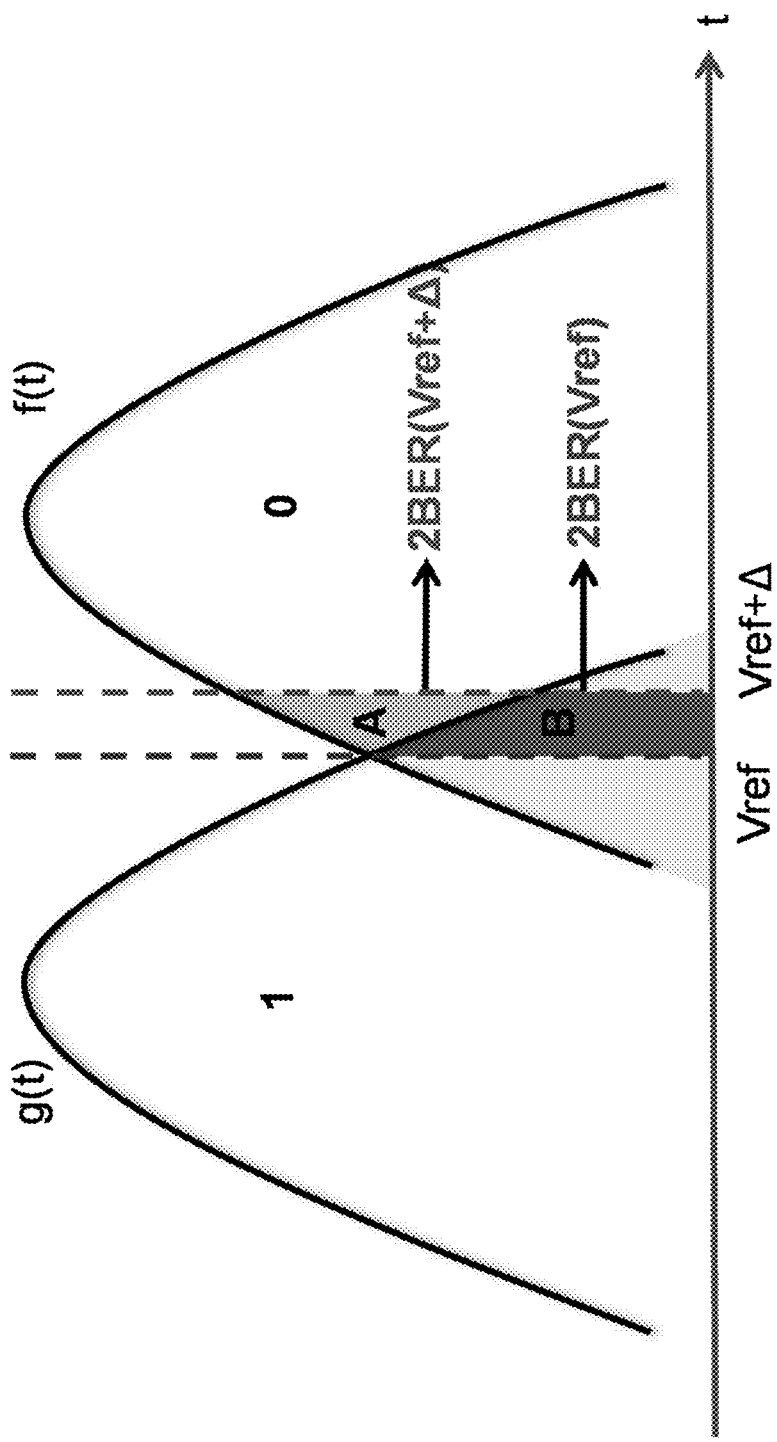
FIG. 5 is a chart of a voltage distribution of a memory cell, in accordance with certain embodiments of the present disclosure.

The BER profile collected by the scheme 300 or SW profiles collected by the scheme 400 can be used to adaptively find the retry delta matched to a predetermined LLR look-up-table. As seen in FIG. 5, the voltage distributions of an SLC cell intersect in the unreliable regions A and B and it is difficult to estimate A and B directly as the distributions are not measured directly either. Instead, if a BER or SW profile is used, then A can be estimated as in: A=2BER(Vref+Δ)−2BER(Vref)≥0, while B is estimated from the BER at the intersection point using B=2αBER($V_{ref}$)≥0. The unknown that needs to be pre-calculated is α, where 0≤α≤1 and BER(X) denotes BER when X is used as a threshold.

Based on the quantities A and B, LLR can be estimated as in:

$$A = 2BER(V_{ref} + \Delta) - 2BER(V_{ref}), B = 2\alpha BER(V_{ref})$$

$$LLR(V_{ref} + \Delta) = \log(B) - \log(A + B) =$$

$$\log\{\alpha BER(V_{ref})\} - \log\{BER(V_{ref} + \Delta) - (1-\alpha)BER(V_{ref})\}$$

To match the LLR(Vref+Δ) of value of "L" from a known look-up table to the decision region represented by A+B, this can be rearranged to give:

$$BER(V_{ref}+\Delta)=\{1+(e^L-1)\alpha\}BER(V_{ref})$$

The previous equation is for an SLC cell, and can easily be extended to an MLC or TLC cell with assumptions ((i) the error probability ratio at each Vref offset location in a page is known and (ii) only neighboring voltage states induce errors into each other). Then for an MLC/TLC page we can generalize the SLC case to:

$$BER(V_{ref}+\Delta)=\{1+(e^L-1)\alpha\beta\}BER(V_{ref})$$

where β is the error probability ratio at each Vref read window in a page. For example, if an MSB page has 2 Vrefs in its read window (Va and Vb), and its total error probability is Pe, Va's error probability is 0.6 Pe, and Vb error probability is 0.4 Pe, then β is 0.6 for Va while it is 0.4 for Vb. If we further assume that errors occur at each Vref locations in a page with equal probability, then, $$\beta = \frac{1}{\#V_{ref}},$$

and hence the only unknown would be only α. If α is characterized (e.g. offline or at another time), then Δ can be found be searching numerically for a solution to the relation:

$$BER(V_{ref} + \Delta) = \left\{1 + \frac{(e^L - 1)\alpha}{\#V_{ref}}\right\} BER(V_{ref})$$

Offline or adaptive characterization (on-the-fly) can be used to find a based on retention or PEC values if the distributions can be estimated using reference written data, In that case states 1 and 0 are distinguishable and we can measure the values:

$$BER0(V_{ref}) \triangleq \tfrac{1}{2}\text{Prob}(\hat{x}=1|x=0,V_{ref}),$$

$$BER1(V_{ref}) \triangleq \tfrac{1}{2}\text{Prob}(\hat{x}=0|x=1,V_{ref}),$$

$$BER0(V_{ref}+\Delta) \triangleq \tfrac{1}{2}\text{Prob}(\hat{x}=1|x=0,V_{ref}+\Delta),$$

and $BER1(V_{ref}+\Delta) \triangleq \tfrac{1}{2}\text{Prob}(\hat{x}=0|x=1,V_{ref}+\Delta).$ Then we can estimate a using:

$$\alpha=1-BER1(V_{ref}+\Delta)/BER1(V_{ref})$$

Figure 6:
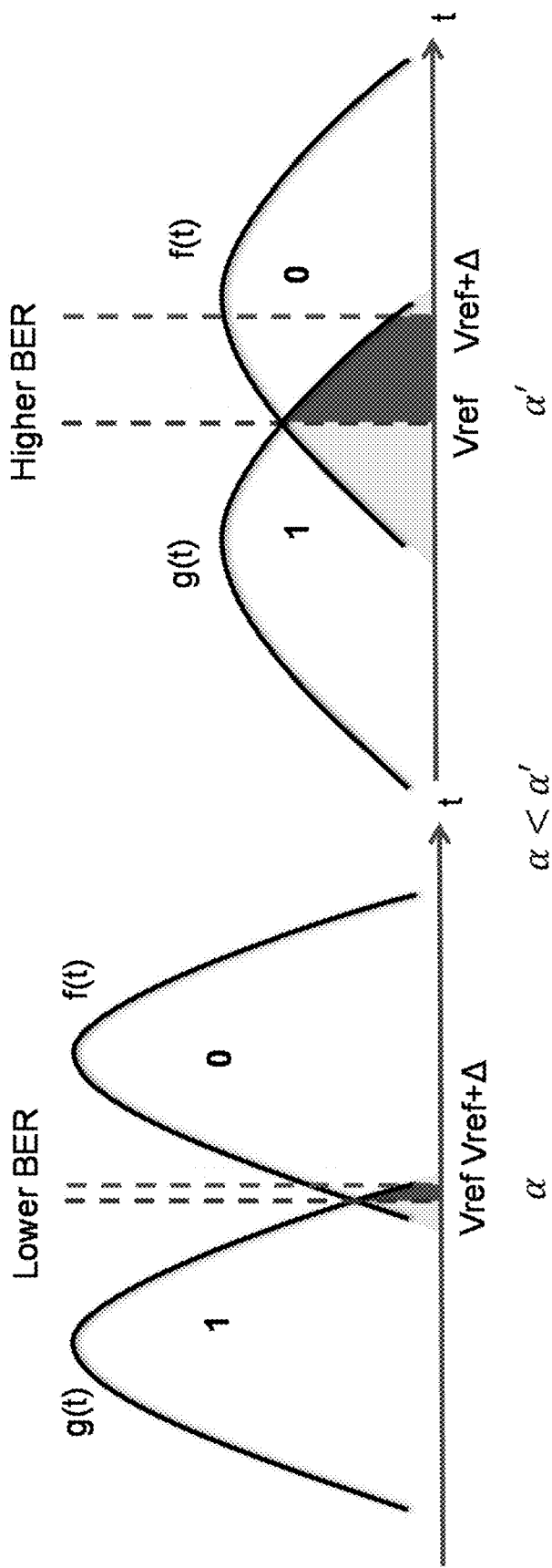
FIG. 6 is a chart of a voltage distribution of a memory cell, in accordance with certain embodiments of the present disclosure.

FIG. 6 shows that a is dependent on the channel conditions and hence the intersection region of voltage states as would be expected from the relations derived above. A lower BER at a good channel condition and low probability of soft LDPC trigger would correspond to a smaller α. On the other hand, a higher BER at a noisy channel condition and high probability of soft LDPC trigger would correspond to a larger α that is closer to 1.

Figure 7:
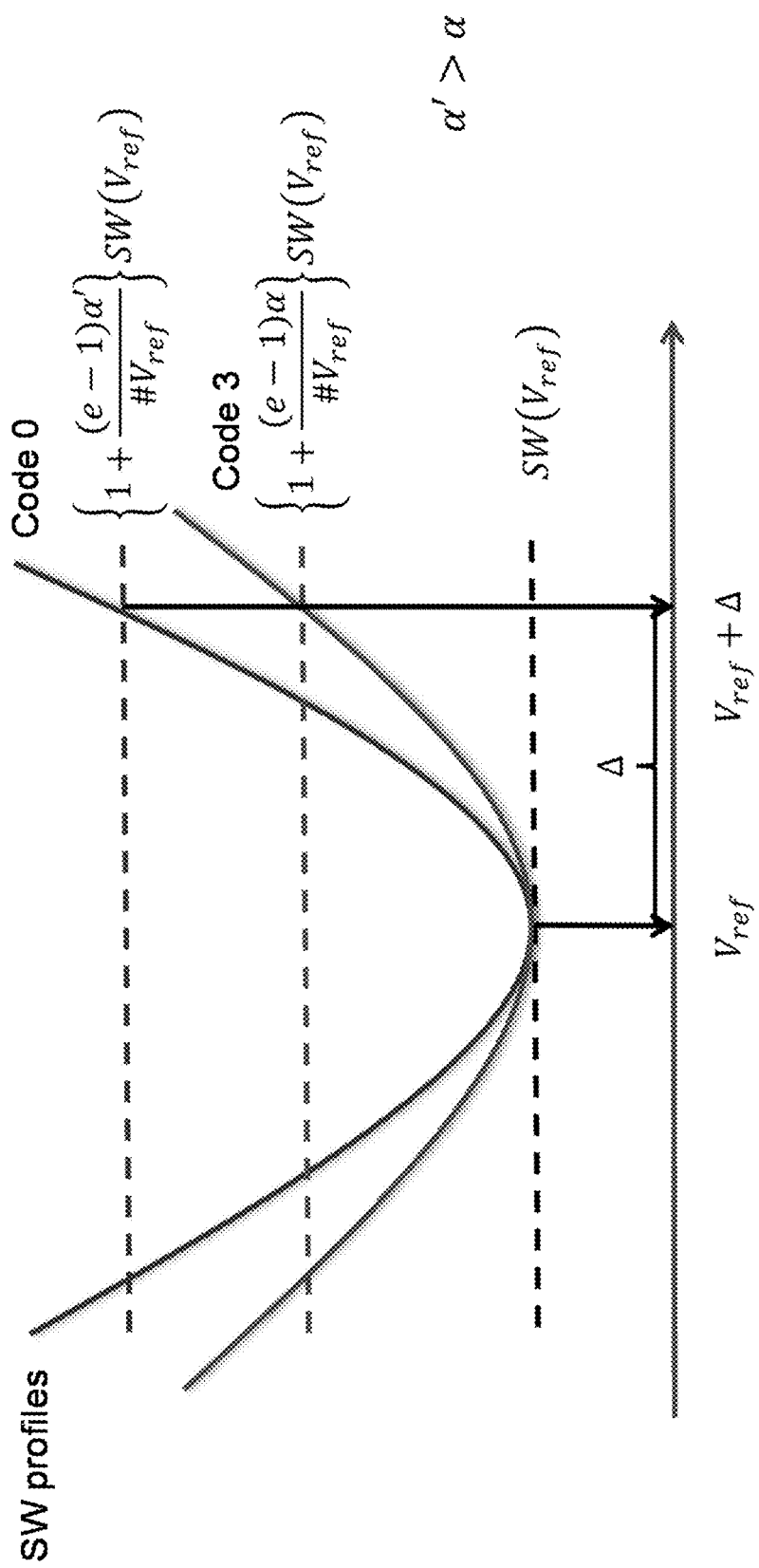
FIG. 7 is a chart of a syndrome weight tracking profile, in accordance with certain embodiments of the present disclosure.

FIG. 7 shows that α can be computed from the SW profile, and it is also dependent on the LDPC code rate being used to find the syndrome weight profile. If the code used has a higher code rate then α would be larger.

Figure 8:
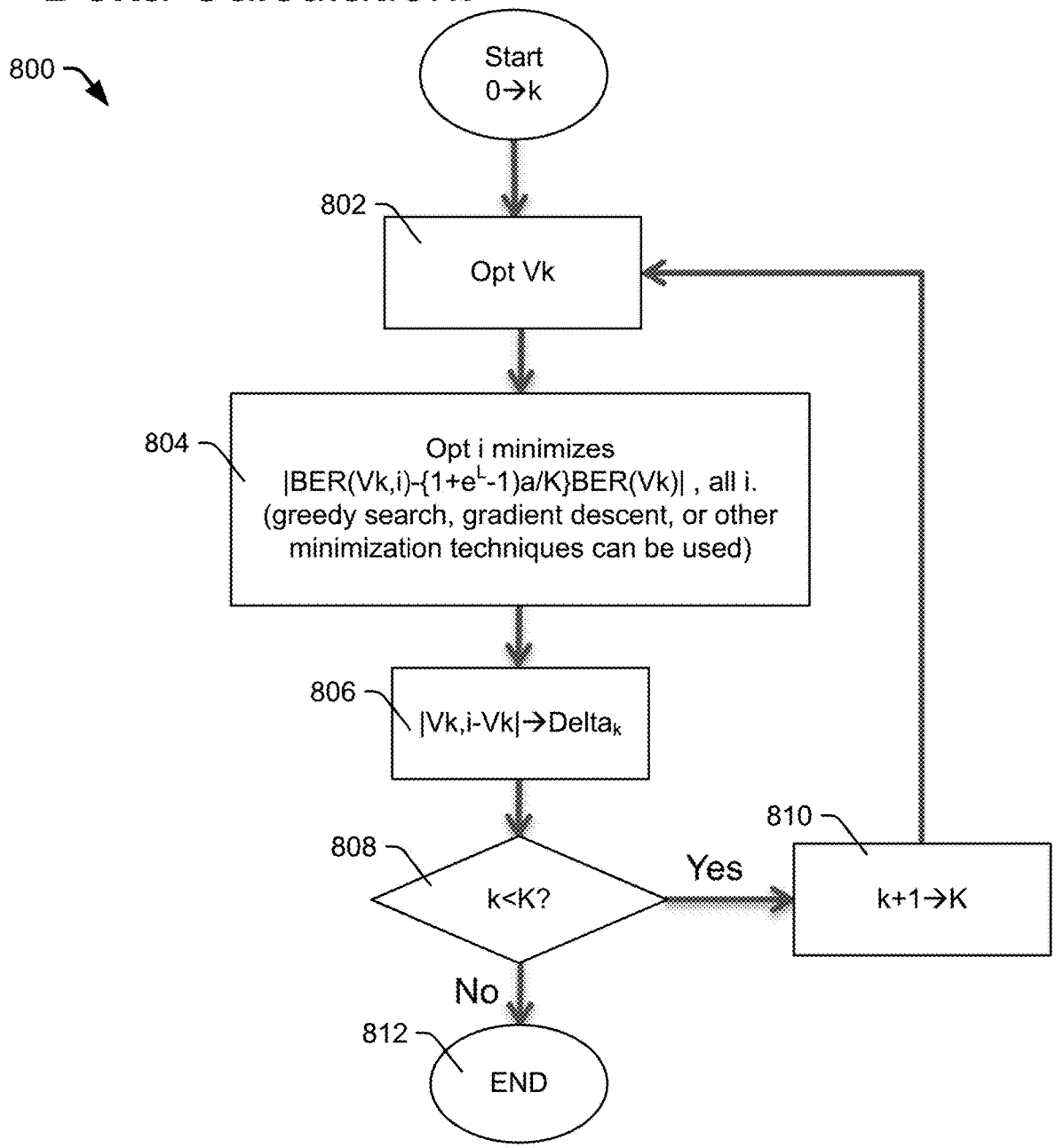
FIG. 8 is a flowchart of a process of adaptive read retry optimization, in accordance with certain embodiments of the present disclosure.

Referring to FIG. 8, a flowchart of a process of adaptive read retry optimization is shown and generally designated 800, in accordance with certain embodiments of the present disclosure. The process 800 shows certain embodiments of a method that can be utilized for determining $V_{ref}$ delta calculation(s). In some examples, the BER profile(s) generated by method 300 or the SW profile(s) generated by method 400 may be utilized in the method 800 to determine the delta calculation 230.

The process 800 may start by receiving an optimized $V_{ref}$, at 802. The $V_{ref}$ may be received from a tracking module, such as described with respect to module 232.

The method 800 helps reduce the cost of soft LDPC (SLDPC) retry cost. In some examples, the number of read retry attempts for SLDPC can be reduced. Also, an SLDPC decoding total iteration number can be minimized if the optimized delta is used at 800. In accordance with the relationship established in this invention between BER($V_k$+Δ) and BER($V_k$), the search process in 804 updates the value of $V_{k,i}$ so as satisfy this equation $$BER(Vki)=\{1+(e^L-1)\alpha/2\}BER(Vk)$$

Which equivalently increments the difference $\Delta=|V_{k,i}-V_k|$ until a Δ is found that matched the value of LLR($V_{k,i}$) to the value "L" as specified by a known LLR Look-up-table mapping. The above equation is an example having two $V_{ref}$ voltages per page.

In other words, from the optimized $V_{ref}$($V_{k,i}$), a delta can be determined, at 806. The delta can be determined based on the default $V_{ref}$($V_k$), such that delta=$|V_{k,i}-V_k|$. The search to solve this equation employs reading the flash memory and evaluating BER($V_{k,i}$) and then substituting in the equation above. The solution can employ a greedy approach in which exhaustive reads and evaluation of the equation is used. Alternatively, a gradient search method in the direction of minimizing the cost function $|V_{k,i}-V_k|$ to reduce the number of reads before finding a solution.

If the number of $V_{ref}$ is less than the preset or threshold number of $V_{ref}$ available to read a page, at 808, the method 800 may select another of the $V_{ref}$ available to read the page, at 810, and perform the method 802 to 808 again. When the number of $V_{ref}$ used to read the page is not less than the preset or threshold number of $V_{ref}$ available to read the page (e.g. all available $V_{ref}$ to read the page have been utilized), the process may end, at 812. When the process ends, the calculated delta can be used as the value to which to adjust the $V_{ref}$.

This disclosure is intended to cover any and all subsequent adaptations or variations of various embodiments. Combinations of the above embodiments, and other embodiments not specifically described herein, will be apparent to those of skill in the art upon reviewing the description. For example, the above algorithm assumes that one delta value for each Vref can be used, but in other examples, two or more different delta values can be utilized for the left and right side of each Vrefs separately based on the same principle of the proposed algorithm. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. An apparatus comprising:
   a solid state memory;
   a controller circuit connected to the solid state memory, the controller circuit including:
     an error tracking circuit configured to determine a condition of the solid state memory based on multiple reads performed on the solid state memory using a range of test reference voltages;
     a delta calculation circuit configured to generate a selected delta amount based on the condition;
     a read circuit configured to:
       apply a reference voltage at a default value to read data from the solid state memory; and
       adjust the reference voltage by the selected delta amount during subsequent attempts to read the data when a previous read fails.

2. The apparatus of claim 1 further comprising:
   the controller circuit further including a memory interface configured to connect the controller circuit to the solid state memory and read the data from the solid state memory using the reference voltage.

3. The apparatus of claim 1 further comprising the condition is determined based on a number of program and erase cycles performed at a target location of the solid state memory.

4. The apparatus of claim 1 further comprising the condition is determined based on a data retention metric of the solid state memory.

5. The apparatus of claim 1 further comprising:
   the controller circuit further including a decoder configured to decode the data read from the solid state memory; and
   the read circuit is configured to adjust the reference voltage when the decoder fails to decode the encoded data during a previous read.

6. The apparatus of claim 5 further comprising the condition includes a bit error rate (BER) for a target location of the solid state memory.

7. The apparatus of claim 6 further comprising:
   the decoder includes a hard low density parity check (HLDPC) decoder; and
   the error tracking circuit is configured to determine the BER based on hard decision decoding (HDD) tracking of bit errors for the combination of the reference voltage and the target location employed during read operations.

8. The apparatus of claim 6 further comprising:
   the error tracking circuit is configured to determine the BER based on syndrome weight (SW) tracking for the combination of the reference voltage and the target location employed during read operations.

9. The apparatus of claim 6 further comprising:
   the error tracking circuit is further configured to determine a BER profile for the target location, including:
     read each page from a selected number of pages of the solid state memory N times using N different reference voltages;
     determine an error rate of the reads; and
     determine the BER profile for the target location, including determine a reference voltage from the N different reference voltages that minimizes the BER over the reads to the selected number of pages.

10. The apparatus of claim 9 further comprising the delta calculation circuit is further configured to generate the selected delta amount for the target location based on the BER profile and a selected log likelihood ratio (LLR) look-up table.

11. The apparatus of claim 1 further comprising:
    the selected delta amount is a different value for each subsequent attempt to read the data when the initial read fails.

12. A method comprising:
    determining, at an error tracking circuit, a condition of a solid state memory based on performing multiple reads to the solid state memory using a range of test reference voltages;
    generating, at a delta calculation circuit, a selected delta amount based on the condition;
    applying, at a read circuit, a reference voltage at a default value to read data from the solid state memory; and
    adjusting, at the read circuit, the reference voltage by the selected delta amount during subsequent attempts to read the data when a previous read fails.

13. The method of claim 12 further comprising determining the condition based on a number of program and erase cycles performed at a target location of the solid state memory.

14. The method of claim 12 further comprising the condition includes a bit error rate (BER) for a target location of the solid state memory.

15. The method of claim 14 further comprising:
    determining, at the error tracking circuit, a BER profile for the target location based on performing a tracking operation, including:
      reading each page from a selected number of pages of the solid state memory N times using N different reference voltages;
      determining an error rate of the reads; and
      determining the BER profile for the target location, including determining a reference voltage from the N different reference voltages that minimizes the BER over the reads of the tracking operation.

16. The method of claim 15 further comprising generating, at the delta calculation circuit, the selected delta amount for the target location based on the BER profile and a selected log likelihood ratio (LLR) look-up table.

17. A memory device storing instructions that, when executed, cause a processor to perform a method comprising:
    determining a condition of a solid state memory according to multiple reads to the solid state memory using a range of test reference voltages;

generating a selected delta amount determined by the condition;

applying a reference voltage at a default value to read data from the solid state memory; and adjusting the reference voltage by the selected delta amount during subsequent attempts to read the data when a previous read fails.

18. The memory device of claim 17 storing instructions that cause a processor to perform a method further comprising:

applying a selected delta amount having a different value for each subsequent attempt to read the data when the initial read fails.

19. The memory device of claim 17 storing instructions that cause a processor to perform a method further comprising:

the condition includes a bit error rate (BER) for a target location of the solid state memory;

determining, at an error tracking circuit, a BER profile for the target location based on performing a tracking operation, including:

reading each page from a selected number of pages of the solid state memory N times using N different reference voltages;

determining an error rate of the reads; and determining the BER profile for the target location, including determining a reference voltage from the N different reference voltages that minimizes the BER over the reads of the tracking operation.

20. The memory device of claim 19 storing instructions that cause a processor to perform a method further comprising:

generating, at a delta calculation circuit, the selected delta amount for the target location based on the BER profile and a selected log likelihood ratio (LLR) look-up table.

* * * * *